US012580540B2

(12) United States Patent
Hoel et al.

(10) Patent No.: US 12,580,540 B2
(45) Date of Patent: Mar. 17, 2026

(54) GAIN CONTROL OF AUDIO DATA USING HARDWARE ACCELERATORS

(71) Applicant: TEXAS INSTRUMENTS INCORPORATED, Dallas, TX (US)

(72) Inventors: Robin O. Hoel, Oslo (NO); Anand Kumar G, Bangalore (IN); Vineet Khurana, Delhi (IN); Aniruddha Periyapatna Nagendra, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 370 days.

(21) Appl. No.: 18/194,065

(22) Filed: Mar. 31, 2023

(65) Prior Publication Data

US 2024/0333241 A1     Oct. 3, 2024

(51) Int. Cl.
| | |
|---|---|
| *H03G 3/30* | (2006.01) |
| *H04R 3/00* | (2006.01) |
| *H04R 29/00* | (2006.01) |

(52) U.S. Cl.
CPC ............. *H03G 3/3089* (2013.01); *H04R 3/00* (2013.01); *H04R 29/004* (2013.01); *H03G 2201/103* (2013.01); *H04R 2430/01* (2013.01)

(58) Field of Classification Search
CPC .. H03G 3/3089; H03G 2201/103; H04R 3/00; H04R 29/004; H04R 2430/01
USPC ............................................ 381/56, 102–109
See application file for complete search history.

(56) References Cited

U.S. PATENT DOCUMENTS

| | | | | |
|---|---|---|---|---|
| 5,677,962 | A * | 10/1997 | Harrison ................ | H03G 3/001 |
| | | | | 381/104 |
| 2012/0226372 | A1* | 9/2012 | Nakamura .............. | G06F 17/00 |
| | | | | 700/94 |
| 2021/0091739 | A1* | 3/2021 | Matamura ............ | H03G 3/3005 |

* cited by examiner

*Primary Examiner* — Xu Mei
(74) *Attorney, Agent, or Firm* — Michelle F. Murray; Frank D. Cimino

(57) ABSTRACT

Various examples disclosed herein relate to digital signal processing, and more particularly, to identifying metrics of audio samples to dynamically adjust the gain of audio data. In an example embodiment, a pulse density modulation system is provided that includes sample generation circuitry and gain control circuitry coupled to the sample generation circuitry. The sample generation circuitry is configured to sample audio data to produce samples of the audio data and output the samples to a processor and to the gain control circuitry. The gain control circuitry is configured to determine one or more metrics based on the samples of the audio data and output the one or more metrics to the processor.

20 Claims, 6 Drawing Sheets

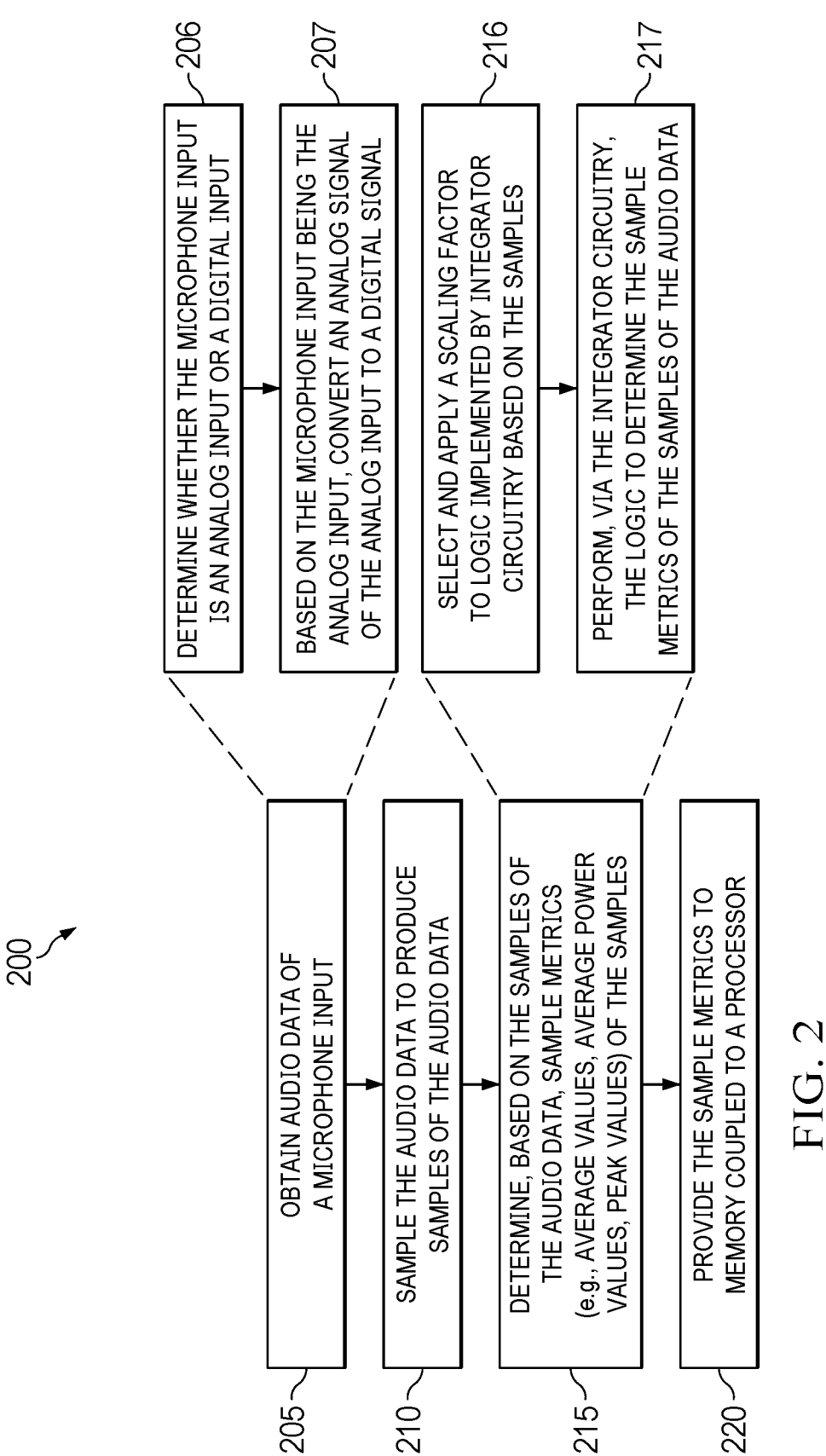

200

205 — OBTAIN AUDIO DATA OF A MICROPHONE INPUT

206 — DETERMINE WHETHER THE MICROPHONE INPUT IS AN ANALOG INPUT OR A DIGITAL INPUT

210 — SAMPLE THE AUDIO DATA TO PRODUCE SAMPLES OF THE AUDIO DATA

207 — BASED ON THE MICROPHONE INPUT BEING THE ANALOG INPUT, CONVERT AN ANALOG SIGNAL OF THE ANALOG INPUT TO A DIGITAL SIGNAL

216 — SELECT AND APPLY A SCALING FACTOR TO LOGIC IMPLEMENTED BY INTEGRATOR CIRCUITRY BASED ON THE SAMPLES

215 — DETERMINE, BASED ON THE SAMPLES OF THE AUDIO DATA, SAMPLE METRICS (e.g., AVERAGE VALUES, AVERAGE POWER VALUES, PEAK VALUES) OF THE SAMPLES

217 — PERFORM, VIA THE INTEGRATOR CIRCUITRY, THE LOGIC TO DETERMINE THE SAMPLE METRICS OF THE SAMPLES OF THE AUDIO DATA

220 — PROVIDE THE SAMPLE METRICS TO MEMORY COUPLED TO A PROCESSOR

FIG. 2

GAIN CONTROL OF AUDIO DATA USING HARDWARE ACCELERATORS

TECHNICAL FIELD

This relates generally to voice and audio processing, and more particularly, to gain control of audio data.

BACKGROUND

Digital microphones, such as pulse density modulation microphones, and analog microphones, such as micro-electromechanical (MEMS) microphones, are often used in voice and audio applications. Audio processing systems can receive audio bit streams from a microphone and analyze the audio bit streams to adjust the gain or other parameters of the audio bit streams and output higher fidelity audio signals.

In a traditional audio processing system, automatic gain control software can be employed to analyze samples of the audio bit streams. Such analysis can include performing various calculations to assess whether the audio bit streams are clipped or require gain adjustment. Problematically, however, such determinations by the automatic gain control software can be bandwidth constraining and consume significant power.

In another traditional audio processing system, a digital signal processing engine can be included to perform signal processing and compute statistics required by the automatic gain control software to reduce bandwidth consumption by the automatic gain control software. However, digital signal processing engines are often expensive and not viable for low-cost voice or audio systems-on-chip.

SUMMARY

Disclosed herein are improvements to voice and audio processing, and more specifically, to gain control of voice and audio signals. Gain control of voice and audio signals refers to adjustments to gain parameters of amplifiers, filters, or other electrical components to increase the resolution and fidelity of a signal. In order to determine whether gain adjustments of an audio signal are needed, various hardware accelerators can be employed to calculate metrics associated with the audio signal and provide the metrics to a processor executing automatic gain control software. Not only do the hardware accelerators reduce processing capacity required to perform such calculations, as in conventional audio processing systems, but also the hardware accelerators can provide results of the calculations to specific memory registers allowing the processor to consume the results while executing automatic gain control software.

In an example embodiment, a pulse density modulation system is provided that includes sample generation circuitry and gain control circuitry coupled to the sample generation circuitry. The sample generation circuitry is configured to sample audio data to produce samples of the audio data and output the samples to a processor and to the gain control circuitry. The gain control circuitry is configured to determine one or more average values based on the samples of the audio data and output the one or more average values to the processor.

This Summary is provided to introduce a selection of concepts in a simplified form that are further described below in the Detailed Description. It may be understood that this Summary is not intended to identify key features or essential features of the claimed subject matter, nor is it intended to be used to limit the scope of the claimed subject matter.

BRIEF DESCRIPTION OF THE DRAWINGS

FIG. 2 illustrates a series of steps for determining audio sample metrics in a gain control system in an implementation.

The drawings are not necessarily drawn to scale. In the drawings, like reference numerals designate corresponding parts throughout the several views. In some examples, components or operations may be separated into different blocks or may be combined into a single block.

DETAILED DESCRIPTION

Figure 1:
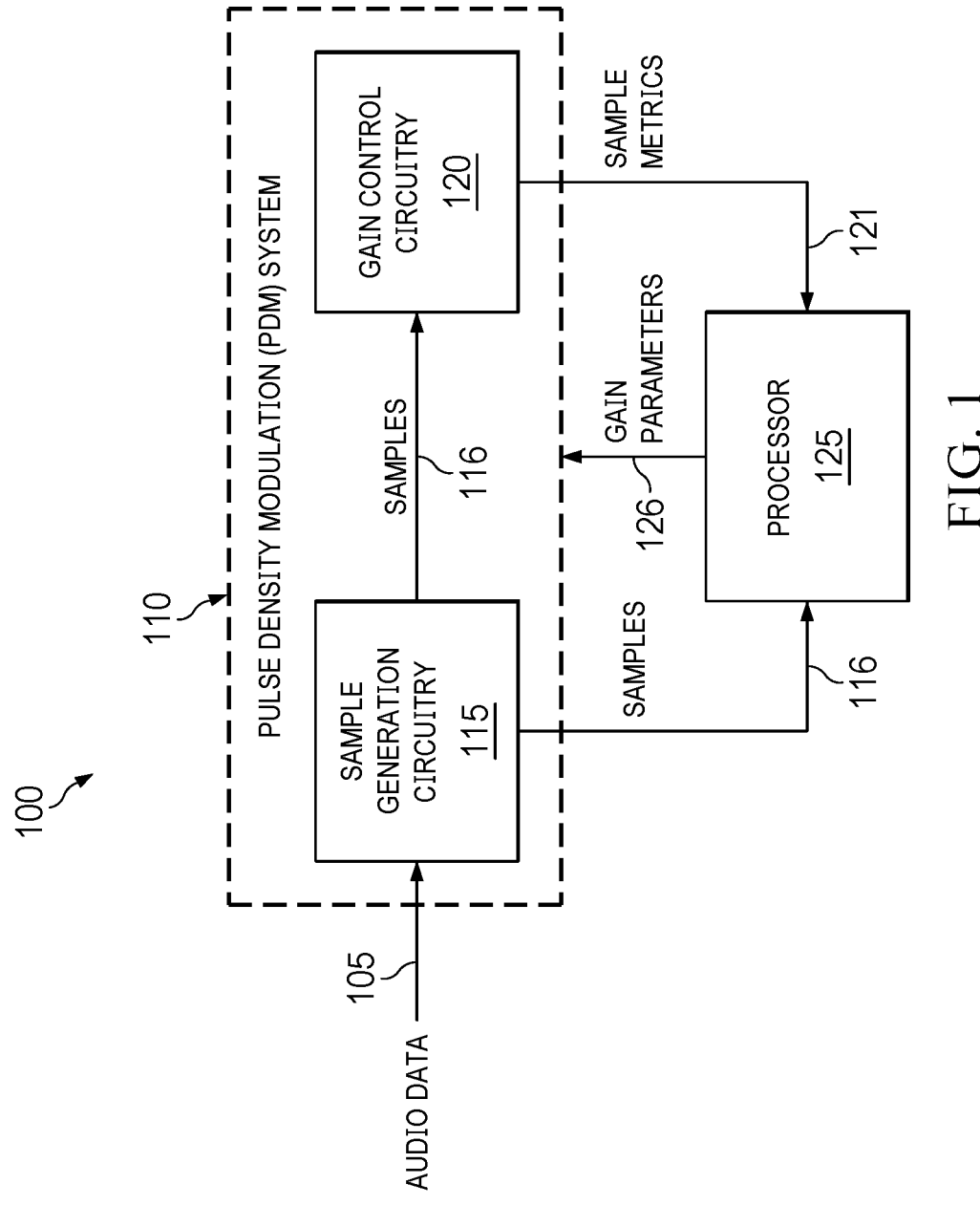
FIG. 1 illustrates an example operating environment configurable to perform gain control processes in an implementation.

Discussed herein are enhanced components, techniques, and systems related to gain control of audio data, and more specifically, to identifying metrics of audio samples to dynamically adjust the gain of the audio data. Gain control of voice and audio signals refers to adjustments to gain parameters of amplifiers, filters, or other electrical components to increase the resolution and fidelity of a signal. Conventional techniques to control gain of audio and voice signals involve computational analysis of the signals in software at the audio codec. However, in embedded systems involving microcontroller units or systems-on-chip, such techniques may consume too much power and processing capacity.

Instead, as disclosed herein, the proposed components and system architecture can utilize one or more hardware accelerators in a pulse density modulation subsystem to perform gain control computations and provide results of the computations to a processor performing the automatic gain control software. Advantageously, various metrics can be determined without using processor resources or capacity, and such metrics can be made available at specific memory registers of a memory coupled to the processor for use by the automatic gain control software when needed.

One example embodiment includes a pulse density modulation system. The pulse density modulation system includes sample generation circuitry and gain control circuitry coupled to the sample generation circuitry. The sample generation circuitry is configured to sample incoming audio data to produce samples of the audio data and output the samples to a processor and to the gain control circuitry. The gain control circuitry is configured to determine one or more metrics (e.g., average values) of the audio data based on the samples of the audio data and output the one or more metrics to the processor.

In another example, a system is provided that includes a processor, sample generation circuitry coupled to the processor, and gain control circuitry coupled to the sample generation circuitry and the processor. The sample generation circuitry is configured to sample audio data to produce samples of the audio data and output the samples to the processor and to the gain control circuitry, and the gain control circuitry is configured to determine, based on the samples of the audio data, one or more metrics (e.g., average values) of the samples and output the one or more metrics to the processor.

In yet another embodiment, a system is provided that includes input selector circuitry, sample generation circuitry, gain control circuitry, and a compensation filter. The input selector circuitry is configured to obtain first audio data from an analog input and second audio data from a digital input and selectively provide one of the first audio data and the second audio data to the sample generation circuitry. The sample generation circuitry is coupled to the input selector circuitry and is configured to sample the first audio data or the second audio data to produce samples and output the samples to gain control circuitry. The gain control circuitry is coupled to the sample generation circuitry and is configured to determine, based on the samples, one or more metrics of the samples and output the one or more metrics to the compensation filter. The compensation filter is coupled to the gain control circuitry and is configured to output processed audio data based on the samples and the one or more metrics.

FIG. 1 illustrates an example operating environment configurable to perform gain control processes in an implementation. FIG. 1 shows operating environment 100, which includes pulse density modulation (PDM) system 110 and processor 125. PDM system 110 further includes sample generation circuitry 115 and gain control circuitry 120. PDM system 110 can be configured to operate audio sampling processes, such as process 200 of FIG. 2 and processor 125 can be configured to operate automatic gain control processes.

PDM system 110 includes sample generation circuitry 115 and gain control circuitry 120 that can produce samples 116 and sample metrics 121 for use by processor 125, among other downstream components, for audio and voice processing activities. PDM system 110 can ingest audio data 105 to produce such data. Audio data 105 is representative of analog audio data or digital audio data from an analog microphone (e.g., a MEMS microphone) or a digital microphone (e.g., a PDM digital microphone), respectively. In an example where audio data 105 includes analog audio data from an analog source, audio data 105 can first be converted to a digital bit stream via an analog-to-digital converter (not shown), such as a sigma-delta analog-to-digital converter either in the sample generation circuitry 115 or a signal chain prior to the sample generation circuitry 115.

Sample generation circuitry 115 includes electrical components and circuitry configured to obtain audio data 105 from a microphone input and sample audio data 105 to produce samples 116. In various examples, sample generation circuitry 115 can produce samples 116 through decimation filtering techniques. Thus, samples 116 may include every Nth sample of the audio data 105. Accordingly, samples 116 may represent pulse-code modulation (PCM) data. However, in other examples, different types of sampling, filtering, and modulation techniques can be employed by sample generation circuitry 115. Sample generation circuitry 115 can provide samples 116 to both gain control circuitry 120 and processor 125 for further use.

Gain control circuitry 120 includes electrical components and circuitry configured to obtain samples 116 and produce sample metrics 121 from samples 116 by performing various computations. In several examples, gain control circuitry 120 can include one or more hardware accelerators, or other fixed-purpose, dedicated hardware components, configured to perform the computations on samples 116 for producing sample metrics 121. More specifically, gain control circuitry 120 can include one or more first-order infinite impulse response (IIR) filters (e.g., leaky integrators) that can perform operations on samples 116.

Sample metrics 121 output by gain control circuitry 120 include one or more average values based on samples 116 and one or more peak values based on samples 116. Following the previous example including hardware accelerators, gain control circuitry 120 can include one or more hardware accelerators configured to calculate the one or more average values and one or more different hardware accelerators configured to calculate the one or more peak values. The average values can include the average values of samples 116 and the average power values of samples 116. The peak values can include the maximum values of samples 116. Sample metrics 121 can also include different metrics or values based on samples 116. Gain control circuitry 120 can provide sample metrics 121 to processor 125. More specifically, in some examples, gain control circuitry 120 can provide sample metrics 121 to memory registers (e.g., addresses of a memory-mapped register (MMR)) of a memory accessible by processor 125.

Processor 125 is representative of one or more processors (e.g., central processing units (CPUs)), processing cores, or microprocessors capable of executing program instructions of software and/or firmware to enable automatic gain control processes described herein. In some cases where processor 125 includes multiple processors, the processors can be implemented in an integrated manner, however, in other cases, the processors can be implemented separately with respect to each other.

Following the previous example where gain control circuitry 120 provides sample metrics 121 to corresponding memory registers, processor 125 can obtain values of sample metrics 121 as needed when executing automatic gain control processes. Processor 125 can also use samples 116 provided by sample generation circuitry 115 when executing automatic gain control processes. Based on samples 116 and sample metrics 121, processor 125 can determine gain parameters 126 corresponding to audio data 105. Gain parameters 126 may include gain values or settings for adjusting the gain of audio data 105. For example, gain parameters 126 may indicate that the gain of audio data 105 should be increased. Accordingly, processor 125 can provide gain parameters 126 to PDM system 110 for PDM system 110 to adjust the gain. In an example where audio data 105 includes analog audio data, PDM system 110 can adjust the gain at a programmable gain amplifier coupled to the analog microphone. In a different example where audio data 105 includes digital audio data, PDM system 110 can adjust the gain at a compensation filter of gain control circuitry 120.

FIG. 2 illustrates a series of steps for determining audio sample metrics in a gain control system in an implementation. FIG. 2 includes process 200 described parenthetically below, which references elements of FIG. 1. Process 200 can be implemented on software, firmware, or hardware, or any combination or variation thereof. Process 200 can be executed by circuitry of a gain control system, such as sample generation circuitry 115 or gain control circuitry 120 of FIG. 1, by one or more processors, such as processor 125 of FIG. 1, or any combination or variation thereof.

In operation 205, sample generation circuitry 115 obtains (205) audio data 105 of a microphone input. Audio data 105 is representative of analog audio data or digital audio data from an analog microphone (e.g., a MEMS microphone) or a digital microphone (e.g., a PDM digital microphone), respectively. Thus, sample generation circuitry 115 may first determine (206) whether the microphone input that generated audio data 105 is an analog input or a digital input. Based on the microphone input being an analog input, an analog-to-digital converter can convert (207) the analog bit stream of audio data 105 to a digital bit stream and provide the digital bit stream to sample generation circuitry 115.

Next, in operation 210, sample generation circuitry 115 samples (210) audio data 105 to produce samples 116 of audio data 105. Sample generation circuitry 115 includes electrical components and circuitry configured to obtain audio data 105 and produce samples 116. In various examples, sample generation circuitry 115 can produce samples 116 through decimation filtering techniques. Accordingly, samples 116 may represent pulse-code modulation (PCM) data. However, in other examples, different types of sampling, filtering, and modulation techniques can be employed by sample generation circuitry 115. Sample generation circuitry 115 can provide samples 116 to both gain control circuitry 120 and processor 125 for further use.

In operation 215, gain control circuitry 120 determines (215) sample metrics 121 (e.g., average values, average power values, peak values) based on samples 116 of audio data 105. Gain control circuitry 120 includes electrical components and circuitry configured to obtain samples 116 and produce sample metrics 121 from samples 116 by performing various computations. In several examples, gain control circuitry 120 can include one or more hardware accelerators, or other fixed-purpose, dedicated hardware components, configured to perform the computations on samples 116 for producing sample metrics 121. More specifically, gain control circuitry 120 can include integrator filter circuitry, such as one or more first-order infinite impulse response (IIR) filters (e.g., leaky integrators) that can perform various operations on samples 116. The operations can represent computations and determinations that, when performed by hardware components of gain control circuitry 120, output sample metrics 121.

Gain control circuitry 120 can select and apply (216) a scaling factor to the function(s) implemented by a leaky integrator, for example. The scaling factor may be a number between 0 and 1 and that is one over a power of two (e.g., ⅛, 1/16, 1/32, 1/64). For example, when a leaky integrator applies an integration function with a small scaling factor, the leaky integrator can output sample metrics 121 faster than leaky integrator can output sample metrics 121 with a larger scaling factor. However, when the leaky integrator applies a similar function but with a larger scaling factor, the leaky integrator may output sample metrics 121 with less noise and better averaging. Then, gain control circuitry 120 can perform (217), via the leaky integrator circuitry, the functions to determine sample metrics 121 of samples 116 of audio data 105.

Sample metrics 121 output by gain control circuitry 120 include one or more average values based on samples 116 and one or more peak values based on samples 116. Following the previous example including hardware accelerators, gain control circuitry 120 can include one or more hardware accelerators configured to calculate the one or more average values and one or more different hardware accelerators configured to calculate the one or more peak values. The average values can include the average values of samples 116 and the average power values of samples 116. The peak values can include the maximum values of samples 116. Sample metrics 121 can also include different metrics or values based on samples 116.

Lastly, in operation 220, gain control circuitry 120 can provide (220) sample metrics 121 to processor 125. More specifically, in some examples, gain control circuitry 120 can provide sample metrics 121 to memory registers (e.g., addresses of a memory-mapped register (MMR)) of a memory coupled to and accessible by processor 125. Gain control circuitry 120 can provide each metric of sample metrics 121 to an individual memory register of the memory. Accordingly, an average value of samples 116 can be available for processor 125 at a first memory register, an average power value of samples 116 can be available for processor 125 at a second memory register, and a peak value of samples 116 can be available for processor 125 at a third memory register.

Figure 3:
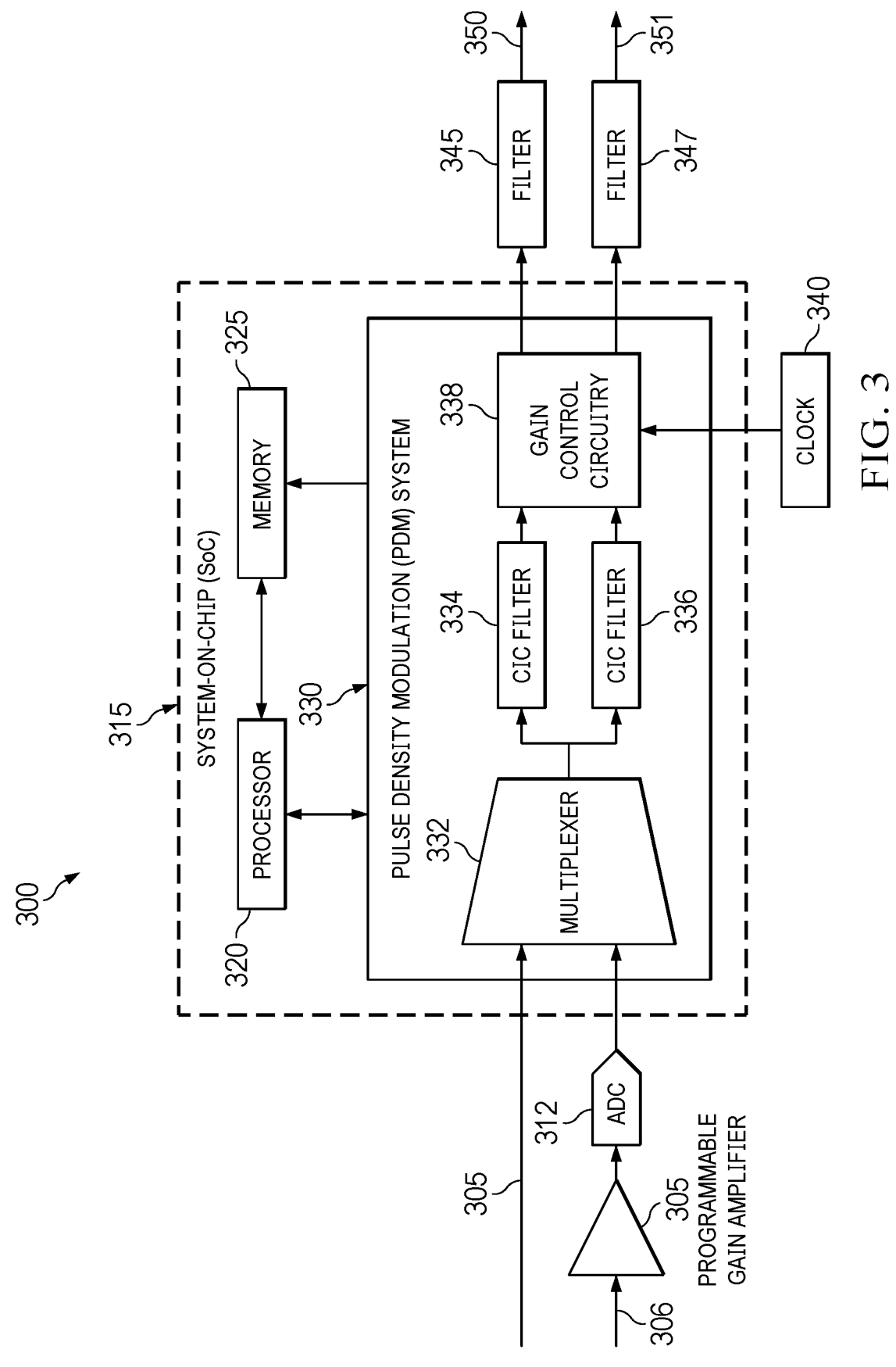
FIG. 3 illustrates an example audio signal processing system in an implementation.

FIG. 3 illustrates an example audio signal processing system in an implementation. FIG. 3 shows system 300, which further includes microphone inputs (digital microphone input 305 and analog microphone input 306), system-on-chip (SoC) 315, clock 340, and filter 345 and 347. SoC 315 further includes processor 320, memory 325, and pulse density modulation (PDM) system 330, which further includes multiplexer 332, cascaded integrator-comb (CIC) filters 334 and 336, and gain control circuitry 338. PDM system 330 can be configured to operate audio sampling and metric generation processes, such as process 200 of FIG. 2, and processor 320 can be configured to operate automatic gain control processes.

In operation, SoC 315 is configured to obtain audio data from digital microphone input 305 or analog microphone input 306, sample the audio data to produce samples, determine metrics based on the samples, and produce processed audio data. Digital microphone input 305 is representative of any type of digital microphone capable of producing digital audio or voice data (e.g., a PDM digital microphone). Analog microphone input 306 is representative of any type of analog microphone capable of producing analog audio or voice data (e.g., a MEMS microphone). Analog microphone input 306 can be coupled to a programmable gain amplifier 310, which can be configured to apply a gain to the analog data of analog microphone input 306. The amplified analog data can then be provided to analog-to-digital converter (ADC) 312, which is representative of any type of ADC configured to convert the analog data to digital data (e.g., a sigma-delta ADC).

PDM system 330 receives the digital bit streams directly from digital microphone input 305 or from ADC 312 at multiplexer 332. Multiplexer 332 is configured to select audio data from one of digital microphone input 305 or analog microphone input 306. In some cases, processor 320 controls the selection of the audio data by multiplexer 332. Multiplexer 332 provides the selected audio data to CIC filters 334 and 336.

CIC filters 334 and 336 are included to perform filtering operations (e.g., decimation filtering) on the digital bit streams to generate pulse-code modulation (PCM) samples. CIC filter 334 may be configured to produce PCM samples for a left channel of the audio data while CIC filter 336 may be configured to produce PCM samples for a right channel of the audio data. CIC filters 334 and 336 can provide the PCM samples both to memory 325 coupled to processor 320 and to gain control circuitry 338. More specifically, CIC filters 334 and 336 can provide the PCM samples to memory registers of memory 325, which can be accessed by processor 320 to obtain the PCM samples.

Gain control circuitry 338 is representative of metrics generation circuitry, such as gain control circuitry 120 of FIG. 1. In various examples, gain control circuitry 338 includes one or more hardware accelerators capable of performing operations on the PCM samples provided by CIC filters 334 and 336. In performing such operations, gain control circuitry 338 can also obtain a clock signal from clock 340 to sync the audio data to the clock signal. Based on the PCM samples from CIC filters 334 and 336 and the clock signal, gain control circuitry 338 can generate metrics, such as average values and peak values of the samples. To do so, gain control circuitry 338 can include integrator filter circuitry, such as one or more first-order infinite impulse response (IIR) filters (e.g., leaky integrators) that can perform the integration and/or filtering functions on the samples to determine the running averages. The average values can include the average values of the samples and the average power values of the samples. The peak values can include the maximum values of the samples. However, in other examples, gain control circuitry 338 can determine other types of metrics. Gain control circuitry 338 can provide these metrics to memory 325, or more specifically, to memory registers corresponding to specific types of metrics. For example, a first memory register may correspond to a first average value, a second memory register may correspond to a second average value, a third memory register may correspond to a first peak value, and so on. Gain control circuitry 338 can also provide the PCM samples to filters 345 and 347.

Processor 320 is representative of one or more processors (e.g., central processing units (CPUs)), processing cores, or microprocessors capable of executing program instructions of software and/or firmware to enable automatic gain control processes described herein. Processor 320 can obtain the samples and the metrics associated with the samples from memory 325 to perform automatic gain control processes. For example, processor 320 can execute automatic gain control software from memory 325. As a result of executing such software, processor 320 can determine gain parameters for the audio data based on the samples and the metrics. The gain parameters may include gain values or settings for adjusting the gain of the audio data provided by either digital microphone input 305 or analog microphone input 306. For example, if the audio data is provided by digital microphone input 305, processor 320 can provide the gain parameters to filters 345 and 347 to influence filtering and amplification techniques implemented by filters 345 and 347. In another example, if the audio data is provided by analog microphone input 306, processor 320 can provide the gain parameters to programmable gain amplifier 310 to influence amplification techniques implemented by programmable gain amplifier 310.

Filters 345 and 347 are representative of compensation filters configured to perform filtering processes on the PCM samples. Filter 345 can obtain PCM samples for the left channel of the audio data, and filter 347 can obtain PCM samples for the right channel of the audio data. Filters 345 and 347 can also use the gain parameters provided by processor 320 to increase or decrease the gain accordingly of the PCM samples. Then, filters 345 and 347 produce processed audio data, processed left channel data 350 and processed right channel data 351, respectively, which can be used by one or more downstream components (not shown).

Figure 4:
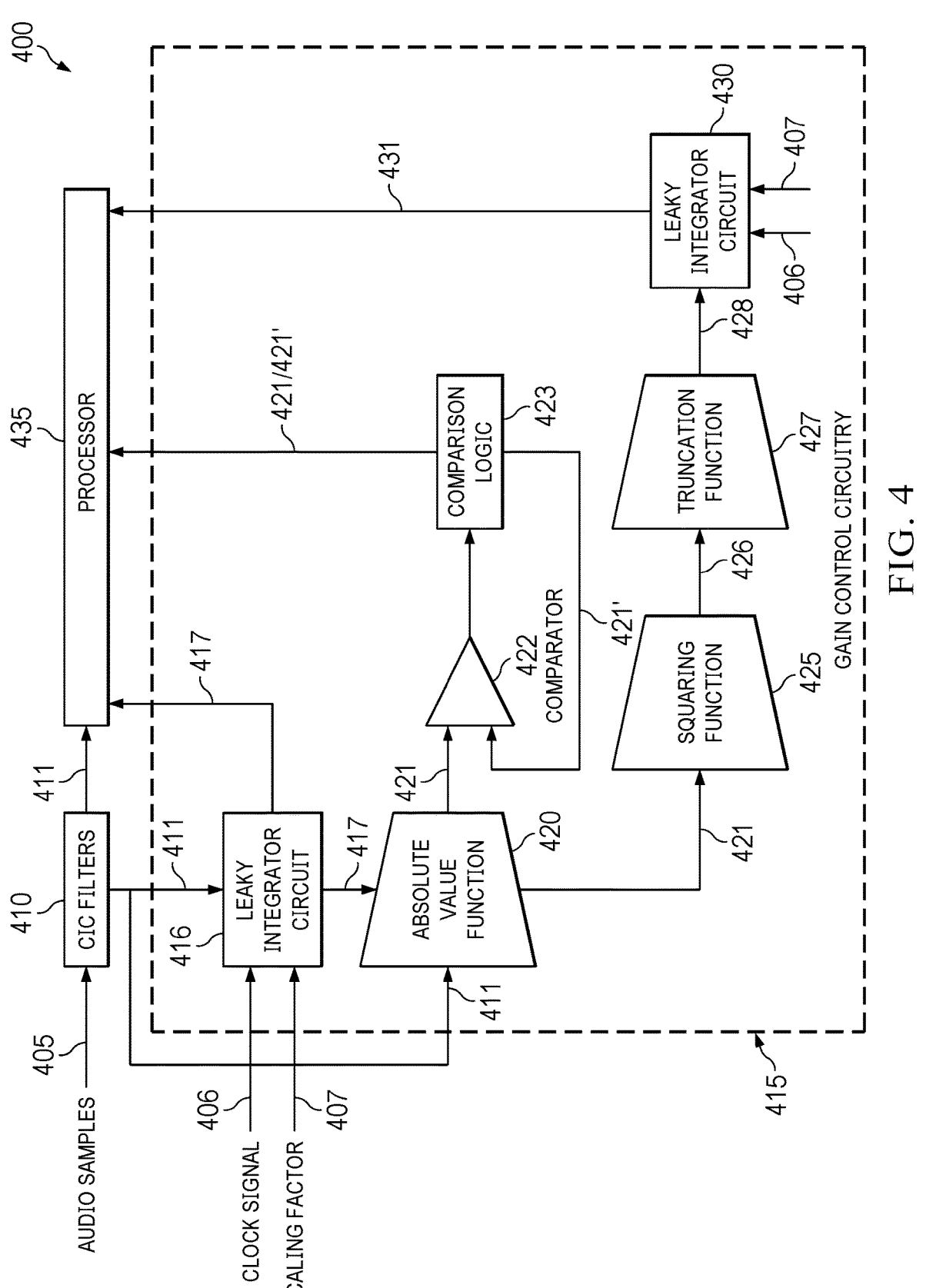
FIG. 4 illustrates an example audio signal processing system in an implementation.

FIG. 4 illustrates an example audio signal processing system in an implementation. FIG. 4 shows system 400, which demonstrates elements, inputs, and outputs of a pulse density modulation system, such as PDM system 330 of FIG. 3. System 400 includes cascaded integrator-comb (CIC) filters 410, gain control circuitry 415, and processor 435. Gain control circuitry 415 may represent elements and components of gain control circuitry 120 of FIG. 1 and gain control circuitry 338 of FIG. 3. Gain control circuitry 415 and processor 435 may be configured to implement sampling and gain control processes described herein, such as process 200 of FIG. 2.

Audio samples 405 may include pulse-density modulation (PDM) samples based on audio or voice data of a microphone sampled by sample generation circuitry (e.g., sample generation circuitry 115 of FIG. 1) and provided to CIC filters 410. CIC filters 410 may include two or more filters configured to convert the PDM samples to pulse-code modulation (PCM) samples 411. For example, one filter of CIC filters 410 can produce left channel samples and another filter of CIC filters 410 can produce right channel samples. CIC filters 410 can provide PCM samples 411 to a memory coupled to processor 435 (not shown; e.g., memory 325 of FIG. 3) and leaky integrator circuit 416 of gain control circuitry 415.

Leaky integrator circuit 416 represents a first-order infinite impulse response (IIR) filter or an exponential moving average filter that can perform operations on PCM samples 411. In executing these operations, leaky integrator circuit 416 can use clock signal 406 and scaling factor 407 to calculate average values 417 of PCM samples 411. Clock signal 406 includes a frequency corresponding to the audio data of PCM samples 411. Scaling factor 407 includes a number between 0 and 1 and that is a one over the power of two (e.g., ⅛, 1/16, 1/32, 1/64) value. Scaling factor 407 may be a pre-configured number. In other cases, processor 435 can provide scaling factor 407 to leaker integrator circuit 416. Leaky integrator circuit 416 can perform integration functions to generate average values 417 and provide average values to the memory coupled to processor 435 and absolute value function 420.

Absolute value function 420 represents hardware components or circuitry configured to perform functions including absolute value calculations. Absolute value function 420 can use both PCM samples 411 and average values 417 to calculate peak values 421 (i.e., maximum values based on PCM samples 411). Absolute value function 420 can provide peak values 421 to comparator 422 and squaring function 425.

Comparator 422 represents hardware or circuitry configured to compare a current peak value (peak value 421) with a previous peak value produced during a previous iteration of a gain control process (peak value 421'). For example, absolute value function 420 can generate peak values 421' during a previous performance of gain control processes. Peak values 421' can be provided to the memory coupled to processor 435 (i.e., stored in a memory register of the memory) for use in automatic gain control processes. Then, during a subsequent performance of gain control processes, comparator 422 can compare peak values 421 to peak values 421' and provide the comparison to comparison logic 423. Comparison logic 423 includes a computation or determination for identifying whether peak values 421 or 421' is a greater peak value. In the case that peak values 421 is greater than peak values 421', comparison logic 423 can replace the value of peak values 421' with the value of peak values 421. However, in the case that peak values 421 is not greater than peak values 421', comparison logic 423 may not replace peak values 421' with peak values 421 in the memory, and thus, peak values 421' may continue to remain available to processor 435 in the memory.

Squaring function 425 represents hardware or circuitry configured to square peak values 421 to produce squared values 426 and provide squared values 426 to truncation function 427. Truncation function 427 represents hardware or circuitry configured to truncate squared values 426 from one bit length to a shorter bit length. For example, PCM samples 411 may include 24-bits of data (e.g., in 2's complement format). Absolute value function 420 can use the 24-bits and produce peak values 421 that include 23-bits of data. Squaring function 425 can produce squared values 426 having 46-bits of data. Thus, truncation function 427 can reduce the bit length of squared values 426 from 46-bits to a shorter length, such as 24-bits of most significant bits, and provide truncated values 428 to leaky integrator circuit 430.

Leaky integrator circuit 430 represents a second first-order IIR filter of gain control circuitry 415 that can perform functions on truncated values 428 to produce average power values 431. Similar to leaky integrator circuit 416, leaky integrator circuit 430 can use clock signal 406 and scaling factor 407 to calculate average power values 431 based on PCM samples 411. Then, leaky integrator circuit 430 can provide average power values 431 to processor 435. In some cases, leaky integrator circuit 430 can use a different value of scaling factor 407 than leaky integrator circuit 416 uses. However, in other cases, leaky integrator circuit 430 and leaky integrator circuit 416 use scaling factor 407 having the same value.

In various examples, when leaky integrator circuit 416, comparison logic 423, and leaky integrator circuit 430 provide average values 417, peak values 421', and average power values 431, respectively, to the memory coupled to processor 435, the components of gain control circuitry 415 provide respective values to corresponding memory registers of a memory coupled to processor 435. For example, average values 417 can be assigned to a first memory register, peak values 421' can be assigned to a second memory register, and average power values 431 can be assigned to a third memory register. Processor 435, when executing program instructions, such as program instructions of automatic gain control software, can access the memory registers to obtain average values 417, peak values 421' and average power values 431 when needed. In several cases, after processor 435 reads the second memory register holding peak values 421', gain control circuitry 415 can remove peak values 421' from the memory (i.e., reset the memory-mapped register).

Although not illustrated in system 400, gain control circuitry 415 may include two of each element shown. For example, one set of elements of gain control circuitry 415 (as shown) may be configured to calculate such metrics described above for a left channel of audio data, and another set of elements of gain control circuitry 415 (not shown) may be configured to calculate the metrics for a right channel of audio data. However, in other cases, the elements shown can calculate metrics for both right and left channels of audio data.

Figure 5:
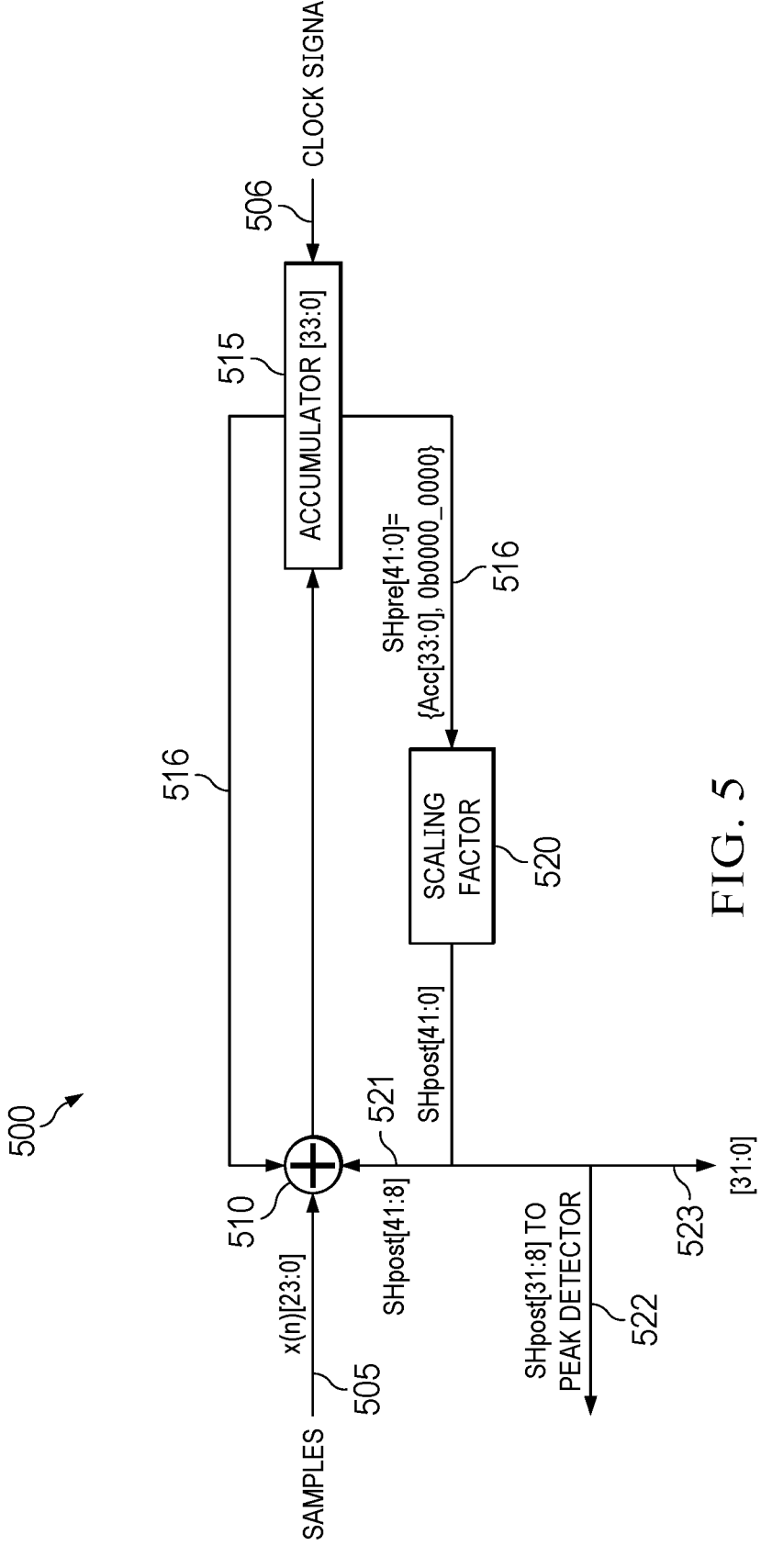
FIG. 5 illustrates an example aspect of gain control circuitry in an implementation.

FIG. 5 illustrates an example aspect of gain control circuitry in an implementation. FIG. 5 shows aspect 500, which demonstrates elements of leaky integrator circuitry, such as leaky integrator circuit 416 and/or leaky integrator circuit 430 of gain control circuitry 415 of FIG. 4.

The leaky integrator circuitry may include a summing node, adder 510, and an accumulator 515, which are configured to perform averaging functions on samples 505 and configure the data format of the results of the averaging functions per system requirements. In various examples, samples 505 can be stored using 24-bits. In such examples, leaky integrator circuitry may be configured to accumulate 34-bits, of which 32-bits can be mapped to memory registers of a memory coupled to a processor for read-out, and 24-bits can be used for internal computations like average and peak value calculations.

Adder 510 can first ingest samples 505, representative of PCM audio data. Samples 505 can be represented as "x(n)" and include 24-bits of data (e.g., bits 23:0 of a data structure). Adder 510 can provide samples 505 to accumulator 515. Accumulator 515 uses clock signal 506 and samples 505 to add an additional number of bits, such as 10 bits, to the data structure of samples 505 and creates samples data 516. In this example, samples data 516 may include 34-bits of data (e.g., bits 33:0 of a data structure).

Adder 510 receives samples data 516 and scaling factor 520 to determine a new number of bits for processor consumption. The new number of bits may be based on scaling factor 520. For example, the new number of bits can be determined using the following equation, where "α" is representative of scaling factor 520:

$$\text{Accumulated bits}=24\text{-bits}+\log_2(1/\alpha)$$

In the example illustrated in aspect 500, scaling factor 520 can lead to the use of 42-bits of data based on scaling factor 520 (e.g., bits 41:0 of a data structure). This new data structure can be shifted and provisioned to various outputs. For example, adder 510 can obtain post-shifted samples data 521 (e.g., bits 41:8), peak detector circuitry (not shown; e.g., absolute value function 420 of FIG. 4) can obtain average values 522 (e.g., bits 31:8), and a memory coupled to a processor (not shown; e.g., memory 325 and processor 320 of FIG. 3) can obtain average values 523 (e.g., bits 31:0). In various examples, bits 31:8 (average values 522), can include integer values of metrics determined based on samples 505, while bits 7:0 can include fractional values to provide additional resolution of the metrics.

The following example of using and accumulating bits with respect to calculating average power values of samples is discussed in reference to elements of FIG. 4. During operation, squaring function 425 can store squared values 426 in a 46-bit internal holding register of gain control circuitry 415. Truncation function 427 can truncate the data and provide 24-bits of squared values 426 to leaky integrator circuit 430 (truncated values 428). Leaky integrator circuit 430 can use scaling factor 407 to determine an additional number of bits beyond the 24-bits from squared values 426. Then, leaky integrator circuit 430 can store average power values to in memory registers and provide average power values 431 to processor 435. The accumulator and registers used by leaky integrator circuit 430 can be reset after processor 435 consumes average power values 431.

Figure 6:
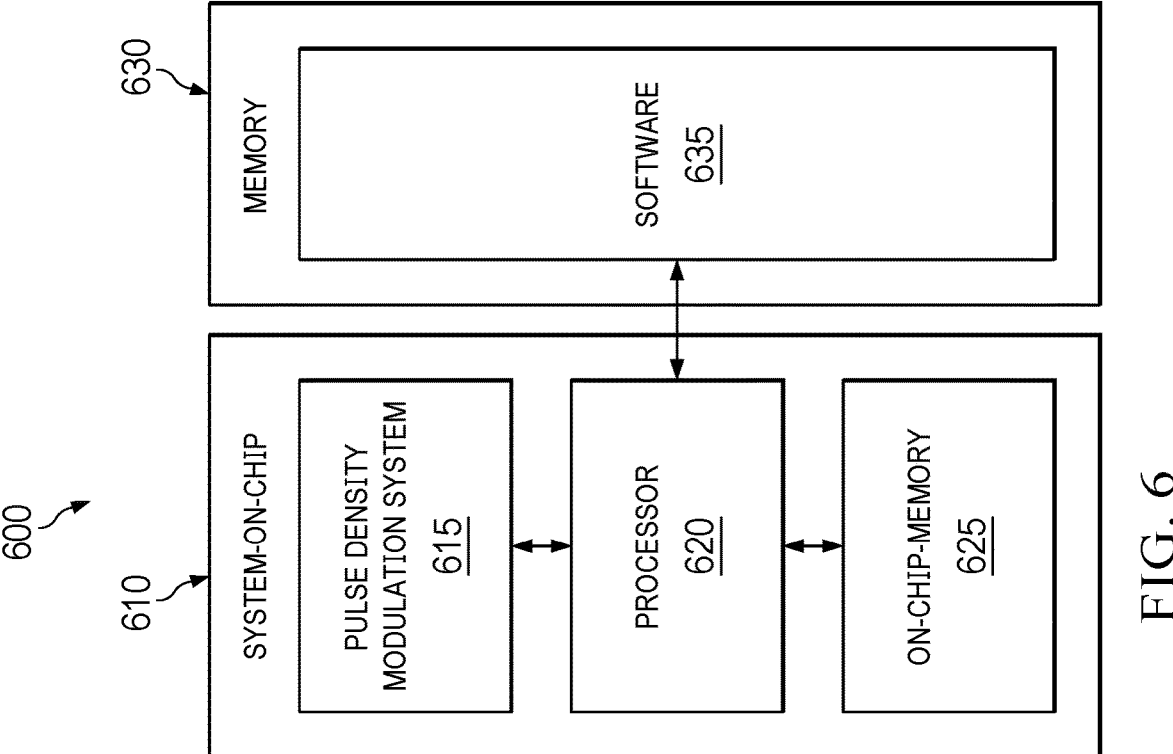
FIG. 6 illustrates an example operating environment for executing software that may be used in accordance with some examples of the present technology.

FIG. 6 illustrates an example operating environment for executing software in an implementation. FIG. 6 includes operating environment 600, which further includes system-on-chip (SoC) 610 and memory 630. SoC 610 further includes pulse density modulation system 615, processor 620, and on-chip memory 625. Memory 630 further includes software 635 executable by processor 620.

SoC 610 is representative of a system or device with which the various operational architectures, processes, scenarios, and sequences disclosed herein for gain control processes may be employed. For example, pulse density modulation system 615 and processor 620 are representative of PDM system 110 and processor 125 of FIG. 1.

Pulse density modulation system 615 includes various electrical components, including logic devices, hardware accelerators, circuitry, and the like. Pulse density modulation system 615 and components thereof can obtain audio data and output samples and metrics related to the audio data to perform sampling and metric generation processes described herein and provide the samples and metrics to processor 620 and/or on-chip memory 625.

Processor 620 can load and execute software 635 stored on memory 630. Software 635 includes and implements gain control processes, such automatic gain control, which is representative of any of the gain control processes discussed with respect to the preceding Figures. When executed by processor 620 to provide gain control functions, software 635 directs processor 620 to operate as described herein for at least the various processes, operational scenarios, and sequences discussed in the foregoing implementations and examples.

Processor 620 may include a microprocessor and other circuitry that retrieves and executes software 635 from memory 630. Processor 620 may be implemented within a single processing device but may also be distributed across multiple processing devices or subsystems that cooperate in executing program instructions. Examples of processor 620 include general purpose central processing units, graphical processing units, application specific processors, and logic devices, as well as any other type of processing device, combinations, or variations thereof.

Memory 630 may include any computer readable storage media readable by processor 620 and capable of storing software 635. In some cases, software 635, or portions of software 635 may also be stored on on-chip memory 625. Like memory 630, on-chip memory may also include any computer readable storage media readable by processor 620. Memory 630 and on-chip memory 625 may include volatile and nonvolatile, removable and non-removable media implemented in any method or technology for storage of information, such as computer readable instructions, data structures, program modules, or other data. Examples of storage media include random access memory, read only memory, magnetic disks, optical disks, optical media, flash memory, virtual memory and non-virtual memory, magnetic cassettes, magnetic tape, magnetic disk storage or other magnetic storage devices, or any other suitable storage media. In no case is the computer readable storage media a propagated signal.

In addition to computer readable storage media, in some implementations, memory 630 and on-chip memory 625 may also include computer readable communication media over which at least some of software 635 may be communicated internally or externally. Memory 630 may be implemented as a single storage device but may also be implemented across multiple storage devices or sub-systems co-located or distributed relative to each other. Memory 630 may include additional elements, such as a controller, capable of communicating with processor 620 or possibly other systems. Similarly, on-chip memory 625 may be implemented as a single storage device but may also be implemented across multiple storage devices or sub-systems co-located or distributed relative to each other. On-chip memory 625 may include additional elements, such as a controller, capable of communicating with processor 620 or possibly other systems.

Software 635 may be implemented in program instructions and among other functions may, when executed by processor 620, direct processor 620 to operate as described with respect to the various operational scenarios, sequences, and processes illustrated herein. For example, software 635 may include program instructions for sample generation and gain control of audio data as described herein.

In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof. Software 635 may include additional processes, programs, or components, such as operating system software, virtualization software, or other application software. Software 635 may also comprise firmware or some other form of machine-readable processing instructions executable by processor 620.

In general, software 635 may, when loaded into processor 620 and executed, transform a suitable apparatus, system, or device overall from a general-purpose computing system into a special-purpose computing system customized to provide gain control functionality as described herein. Indeed, encoding software 635 on memory 630 may transform the physical structure of memory 630. The specific transformation of the physical structure may depend on various factors in different implementations of this description. Examples of such factors may include, but are not limited to, the technology used to implement the storage media of memory 630 and whether the computer-storage media are characterized as primary or secondary storage, as well as other factors.

For example, if the computer readable storage media are implemented as semiconductor-based memory, software 635 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

While some examples provided herein are described in the context of audio processing systems, sample generation circuitry, gain control circuitry, electrical components and environments thereof, the gain control systems and methods described herein are not limited to such embodiments and may apply to a variety of other processes, systems, applications, devices, and the like. Aspects of the present invention may be embodied as a system, method, computer program product, and other configurable systems. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Unless the context clearly requires otherwise, throughout the description and the claims, the words "comprise," "comprising," and the like are inclusive meaning "including, but not limited to." In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A. A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or." in reference to a list of two or more items, covers all of the following interpretations of the word: any of the items in the list, all of the items in the list, and any combination of the items in the list.

The phrases "in some embodiments," "according to some embodiments," "in the embodiments shown," "in other embodiments." and the like generally mean the particular feature, structure, or characteristic following the phrase is included in at least one implementation of the present technology, and may be included in more than one implementation. In addition, such phrases do not necessarily refer to the same embodiments or different embodiments.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for" but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:
1. A pulse density modulation system, comprising:
a multiplexer;
sample generation circuitry coupled to the multiplexer; and
gain control circuitry coupled to the sample generation circuitry;
wherein the sample generation circuitry is configured to sample audio data selectively provided by the multiplexer among multiple audio data selections to produce samples of the audio data and output the samples to a processor and to the gain control circuitry; and
wherein the gain control circuitry is configured to determine one or more metrics based on the samples of the audio data and output the one or more metrics to the processor.
2. The pulse density modulation system of claim 1, wherein the one or more metrics includes one or more of average values of the samples of the audio data and peak values of the samples of the audio data.
3. The pulse density modulation system of claim 2, wherein the average values comprise sample average values and sample average power values.
4. The pulse density modulation system of claim 1, wherein the audio data includes one of a digital audio signal or an analog audio signal.
5. The pulse density modulation system of claim 4, wherein, based on the audio data including the analog audio signal, the sample generation circuitry is configured to convert the analog audio signal to a digital signal prior to producing the samples of the audio data.

6. The pulse density modulation system of claim 1, wherein the gain control circuitry comprises a leaky integrator circuit of the gain control circuitry to determine the one or more metrics.

7. The pulse density modulation system of claim 1, wherein to output the one or more metrics to the processor, the gain control circuitry is configured to provide the one or more metrics to corresponding memory registers of a memory coupled to the processor.

8. A system, comprising:

a processor;

input selector circuitry;

sample generation circuitry coupled to the input selector circuitry, the processor, and gain control circuitry; and the gain control circuitry coupled to the sample generation circuitry and the processor;

wherein the sample generation circuitry is configured to sample audio data selectively provided by the input selector circuitry among multiple audio data selections received by the input selector circuitry to produce samples of the audio data and output the samples to the processor and to the gain control circuitry;

wherein the gain control circuitry is configured to determine, based on the samples of the audio data, one or more metrics of the samples and output the one or more metrics to the processor;

wherein the processor is configured to determine a gain to apply to the audio data based on the samples and the one or more metrics.

9. The system of claim 8, wherein the one or more metrics includes one or more of average values of the samples of the audio data and peak values of the samples of the audio data.

10. The system of claim 9, wherein the average values comprise sample average values and sample average power values.

11. The system of claim 8, wherein the audio data includes one of a digital audio signal or an analog audio signal.

12. The system of claim 11, wherein, based on the audio data including the analog audio signal, the sample generation circuitry is configured to convert the analog audio signal to a digital signal prior to producing the samples of the audio data.

13. The system of claim 8, wherein the gain control circuitry comprises a leaky integrator circuit of the gain control circuitry to determine the one or more average values.

14. The system of claim 8, wherein to output the one or more average values to the processor, the gain control circuitry is configured to provide the one or more average values to corresponding memory registers of a memory coupled to the processor.

15. A system, comprising:

input selector circuitry configured to obtain first audio data from an analog input and second audio data from a digital input and selectively provide one of the first audio data and the second audio data to sample generation circuitry;

the sample generation circuitry coupled to the input selector circuitry and configured to sample the first audio data or the second audio data to produce samples and output the samples to gain control circuitry;

the gain control circuitry coupled to the sample generation circuitry and configured to determine, based on the samples, one or more metrics of the samples and output the one or more metrics to a compensation filter; and the compensation filter coupled to the gain control circuitry and configured to output processed audio data based on the samples and the one or more metrics.

16. The system of claim 15, further comprising a programmable gain amplifier and an analog-to-digital converter coupled between the analog input and the input selector circuitry, wherein the programmable gain amplifier is configured to apply a gain to analog audio data from the analog input, and wherein the analog-to-digital converter is configured to convert the analog audio data to the first audio data.

17. The system of claim 15, further comprising a processor configured to:

obtain the samples from the sample generation circuitry;

obtain the one or more metrics of the samples from the gain control circuitry; and determine a gain parameter based on the samples and the one or more metrics.

18. The system of claim 17, wherein the processor is further configured to provide the gain parameter to the compensation filter based on the input selector circuitry selectively providing the second audio data from the digital input to the sample generation circuitry and to provide the gain parameter to a programmable gain amplifier coupled between the analog input and the input selector circuitry based on the input selector circuitry selectively providing the first audio data from the analog input to the sample generation circuitry.

19. The system of claim 15, wherein the one or more metrics comprise one or more of sample average values, average power values, and peak values of the samples of the audio data.

20. The system of claim 15, wherein the gain control circuitry is configured to provide the one or more metrics to memory registers of a memory coupled to a processor.

* * * * *